(12) United States Patent
Kellman et al.

(10) Patent No.: US 7,154,268 B2
(45) Date of Patent: Dec. 26, 2006

(54) METHOD AND APPARATUS TO IMPROVE AN MRI IMAGE USING REGULARIZATION

(75) Inventors: Peter Kellman, Bethesda, MD (US); Elliot McVeigh, Phoenix, MD (US)

(73) Assignee: The United States of America as represented by the Secretary of the Department of Health and Human Services, Washington, DC (US)

( * ) Notice: Subject to any disclaimer, the term of this patent is extended or adjusted under 35 U.S.C. 154(b) by 7 days.

(21) Appl. No.: 10/492,897

(22) PCT Filed: Oct. 17, 2002

(86) PCT No.: PCT/US02/33571

§ 371 (c)(1),
(2), (4) Date: Apr. 15, 2004

(87) PCT Pub. No.: WO03/032816

PCT Pub. Date: Apr. 24, 2003

(65) Prior Publication Data

US 2004/0207402 A1   Oct. 21, 2004

Related U.S. Application Data

(60) Provisional application No. 60/348,005, filed on Oct. 19, 2001.

(51) Int. Cl.
*G01V 3/00* (2006.01)

(52) U.S. Cl. ........................ 324/309; 324/318

(58) Field of Classification Search ................ 324/309, 324/307, 319, 318, 306, 322, 300; 600/410, 600/421, 422
See application file for complete search history.

(56) References Cited

U.S. PATENT DOCUMENTS 5,068,609 A * 11/1991 Bruder et al. ................ 324/309
5,138,259 A *  8/1992 Schmitt et al. .............. 324/309
5,959,966 A    9/1999 Torkkola (Continued)

OTHER PUBLICATIONS

King et al., "SENSE Image Quality Improvement Using Matrix Regularization." *Proc. Intl. Soc. Mag. Reson. Med*, 9:1771, 2001.

(Continued)

*Primary Examiner*—Brij B. Shrivastav
(74) *Attorney, Agent, or Firm*—Klarquist Sparkman, LLP

(57) ABSTRACT

An MRI imaging system includes at least one processor and a plurality of coils to acquire a plurality of k-space samples of a target to image. The system includes a machine-readable media comprising instructions which, when executed by the processor, result in determining a plurality of different regularization matrices for a plurality of different regions of an image of the target. The regularization matrices are applied in the determination of a plurality of unmixing matrices for the regions. The unmixing matrices are applied to produce the image without ghost artifacts, from a plurality of MRI images produced from the plurality of k-space samples and each comprising ghost artifacts.

22 Claims, 5 Drawing Sheets

U.S. PATENT DOCUMENTS

| | | | |
|---|---|---|---|
| 6,100,689 A * | 8/2000 | Huff et al. | 324/309 |
| 6,236,862 B1 * | 5/2001 | Erten et al. | 455/501 |
| 6,249,595 B1 * | 6/2001 | Foxall et al. | 382/128 |
| 6,448,771 B1 | 9/2002 | Harvey et al. | |
| 6,492,810 B1 * | 12/2002 | Hajnal | 324/309 |
| 6,518,760 B1 * | 2/2003 | Fuderer et al. | 324/307 |
| 6,556,009 B1 | 4/2003 | Kellman et al. | |
| 6,700,374 B1 * | 3/2004 | Wu et al. | 324/312 |
| 6,771,067 B1 * | 8/2004 | Kellman et al. | 324/307 |
| 2002/0167315 A1 | 11/2002 | Kellman et al. | |
| 2005/0017870 A1 * | 1/2005 | Allison et al. | 340/825.19 |

OTHER PUBLICATIONS

Pruessmann et al., "SENSE: Sensitivity Encoding for Fast MRI." *Magnetic Resonance in Medicine*, 42:952-962, 1999.

Roemer et al., "The NMR Phased Array." *Magnetic Resonance in Medicine*, 16:192-225, 1990.

Kellman et al., "Adaptive Sensitivity Encoding Incorporating Temporal Filtering (TSENSE)," *Magnetic Resonance in Medicine*, vol. 45, Issus 5, pp. 846-852 (published online Apr. 16, 2001).

Kellman et al., "Ghost Artifact Cancellation Using Phased Array Processing," *Magnetic Resonance in Medicine*, vol. 46, Issue 2, pp. 335-343 (published online Jul. 24, 2001).

Kellman et al., "SENSE Coefficient Calculation using Adaptive Regularization," *ISMRM Workshop on Minimum MR Data Acquisition Methods*, Marco Island, Florida, 4 pp. (Oct. 20-21, 2001).

* cited by examiner

METHOD AND APPARATUS TO IMPROVE AN MRI IMAGE USING REGULARIZATION

CROSS REFERENCE TO RELATED APPLICATIONS

This is the U.S. National Stage of International Application No. PCT/US02/33571, filed Oct. 17, 2002, which was published under PCT Article 21(2), Publication No. WO 03/032816 A2, and which claims the benefit of U.S. Provisional Application No. 60/348,005 filed Oct. 19, 2001, which is incorporated herein in its entirety.

RELATED APPLICATION

This application claims the benefit of U.S. Provisional Patent Application No. 60/348,005 filed Oct. 19, 2001.

TECHNICAL FIELD

The disclosure relates generally to Magnetic Resonance Imaging (MRI), and more particularly to artifact cancellation in MR generated images.

BACKGROUND

Magnetic Resonance Imaging (MRI) is an imaging technique based in part on the absorption and emission of energy in the radio frequency range. To obtain the necessary magnetic resonance (MR) images, a patient (or other target) is placed in a magnetic resonance scanner. The scanner provides a magnetic field that causes magnetic moments in the patient or target atoms to align with the magnetic field. The scanner also includes coils that apply a transverse magnetic field. RF pulses are emitted by the coils, causing the target atoms to absorb energy. In response to the RF pulses, photons are emitted by the target atoms and detected as signals in receiver coils.

The signals detected in the receiver coils may be processed to construct an image of the target. The signals may be made proportional to the spatial frequency content (k-space) of the image through the proper application of gradients to the magnetic field. The k-space may comprise sets of samples, called lines, each line corresponding to a single phase encoding of the sampling process. It is well known that the number and spacing of lines in k-space determines both the field of view (FOV) and the spatial resolution of the reconstructed image.

Data processing may be performed on the k-space samples to produce a final image of the object in "image space", e.g. a spatial arrangement of pixels. The data processing is typically performed using a computer, which is any device comprising a processor and memory, wherein the processor executes instructions and acts upon data provided from the memory.

Rapid imaging is desirable in order to reduce the time required to perform volume imaging consisting of a large number of slices, to reduce the breath-hold time, or for dynamic imaging applications such as functional imaging of the heart or brain. Rapid imaging also provides increased motion tolerance. A number of accelerated imaging methods have been developed. In several of these methods, undesirable "ghost" artifacts arise when the k-space samples are processed into the image domain. In one such method, known as echo-planar imaging (EPI), distortions in k-space may lead to image domain ghosts. In another such method, known as SENSE, intentional k-space undersampling (sampling fewer lines than the number required to image a chosen field-of-view) accelerates the data acquisition but results in image domain ghosts due to aliasing. For more details on SENSE see Pruessmann et al., *SENSE: Sensitivity Encoding for Fast MRI*, Magnetic Resonance in Medicine, 1999 Nov; 42(5): 952–962.) With the SENSE approach, ghost artifacts which arise from aliasing may be suppressed in the image by way of a technique known as "phased array combining". Phased array combining may be applied to suppress ghost artifacts arising from a variety of mechanisms, not just aliasing. U.S. patent application Ser. No. 09/825,617, entitled *Ghost Artifact Cancellation Using Phased Array Processing*, and filed on Apr. 3, 2001, by Kellman et al. (henceforth "Kellman 1"), teaches one such phased array combining approach.

Phased array combining approaches for ghost cancellation (including SENSE) involve combining multiple intermediate images, each comprising ghost artifacts, to produce a final image in which ghost artifacts are suppressed. Often, the intermediate images are combined in a manner which is numerically ill-conditioned, so that noise in the intermediate images as well as errors in the combining weights (brought on, for instance, by noise in the operation and characterization of the signal reception process) may amplify noise in the final image. One technique to mitigate this problem is called regularization or matrix conditioning. Regularization involves a tradeoff between a level of ghost artifact suppression and noise amplification. Current approaches apply a fixed amount of regularization to all pixels of an image. Such approaches do not take into account that particular regions (sets of one or more pixels) of the final image may benefit from substantially less ghost suppression than others, and therefore can benefit from greater noise reduction by trading off more ghost suppression than in other regions of the image.

SUMMARY OF THE DISCLOSURE

In one aspect, a MRI imaging system includes at least one processor and coils to acquire k-space samples of a target to image. The system includes a machine-readable media comprising instructions which, when executed by the processor, result in determining different regularization matrices for different regions of an image of the target. The regularization matrices are applied in the determination of unmixing matrices for the different pixel positions. The unmixing matrices are applied to produce the image without ghost artifacts from intermediate MRI images produced from the plurality of k-space samples, the intermediate images each having ghost artifacts.

In another aspect, a MRI imaging system includes coils to acquire reduced k-space samples for intermediate images. An apparatus comprising at least one processor executes instructions to combine the intermediate images to produce a full field of view image, by applying unmixing matrices. Each unmixing matrix is regularized according to a target level of alias suppression for a region of the full field of view image.

DETAILED DESCRIPTION

In the following description and figures, like numbers refer to like elements. References to "one embodiment" and "an embodiment" do not necessarily refer to the same embodiment, although they may. Furthermore, the singular terms "a," "an," and "the" include plural referents unless the context clearly indicates otherwise.

Throughout this description, embodiments may be described which apply matrix regularization on a pixel-by-pixel basis. Other embodiments may operate in substantially similar manners but may regularize according to regions of an image larger than a single pixel (for example, upon groups of neighboring pixels). In the figures, images may be illustrated as pixel maps. These pixel maps are provided for illustration purposes only and may represent, in some instances, the complex values from which the pixel intensity magnitudes are generated.

Overview

Figure 1:
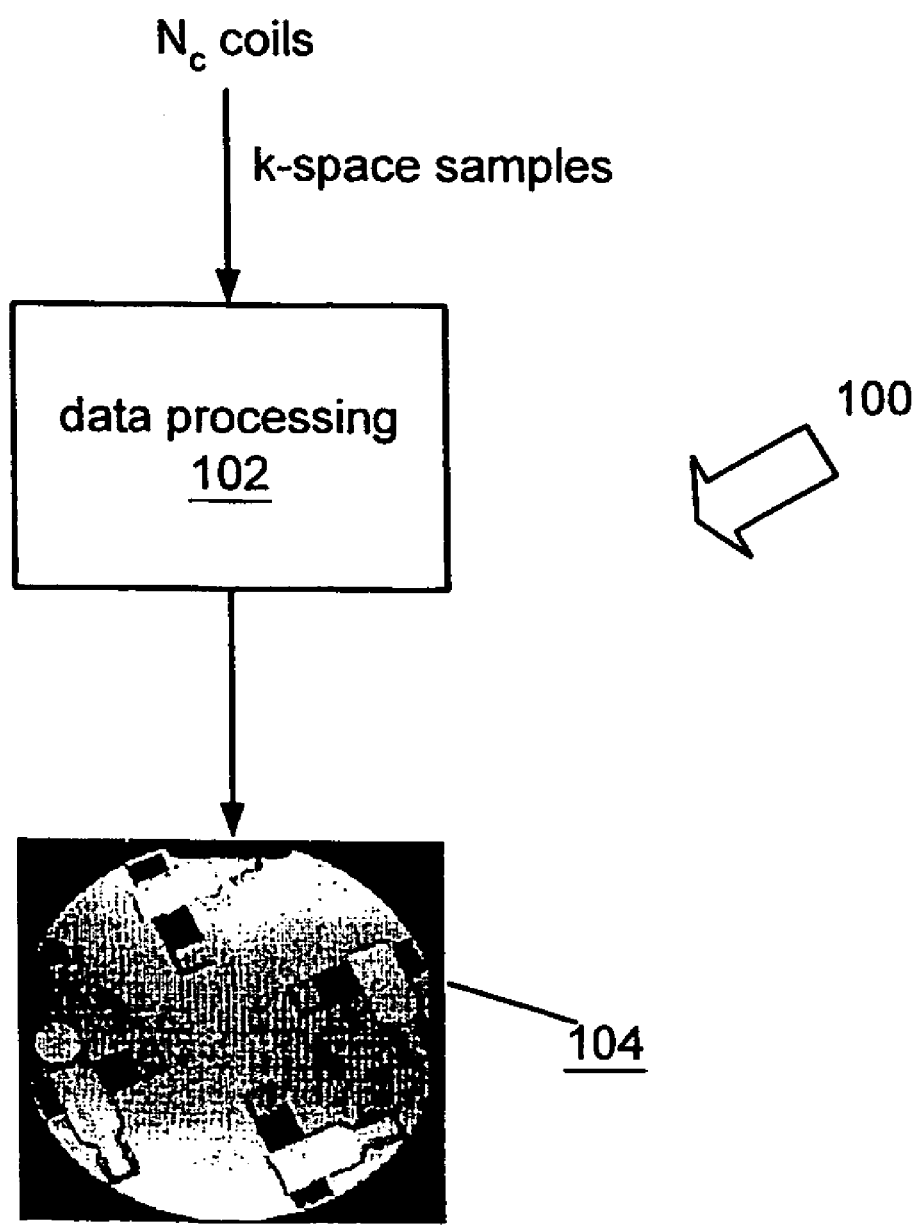
FIG. 1 is a high-level block diagram of an MRI method embodiment.

FIG. 1 is a high-level block diagram of an MRI method embodiment 100. A set of k-space samples is acquired from $N_c$ receiver coils, where $N_c$ is an integer number. For example, $N_c$=4 when four coils are employed. Data processing is performed at 102 to produce a final image 104. In general, the data processing involves (1) producing a plurality of intermediate images from the reduced k-space samples, and (2) combining the intermediate images into a final image. The intermediate images may contain ghost artifacts arising from the k-space acquisition, for example arising from EPI distortions or undersampling. The intermediate images may be combined to produce the final image while suppressing ghost artifacts.

For simplicity, the following discussion applies to an application comprising a single ghost artifact in each intermediate image. The discussion is generally applicable to situations involving a greater number of ghost artifacts as well.

Acquiring the Intermediate Images

Figure 2:
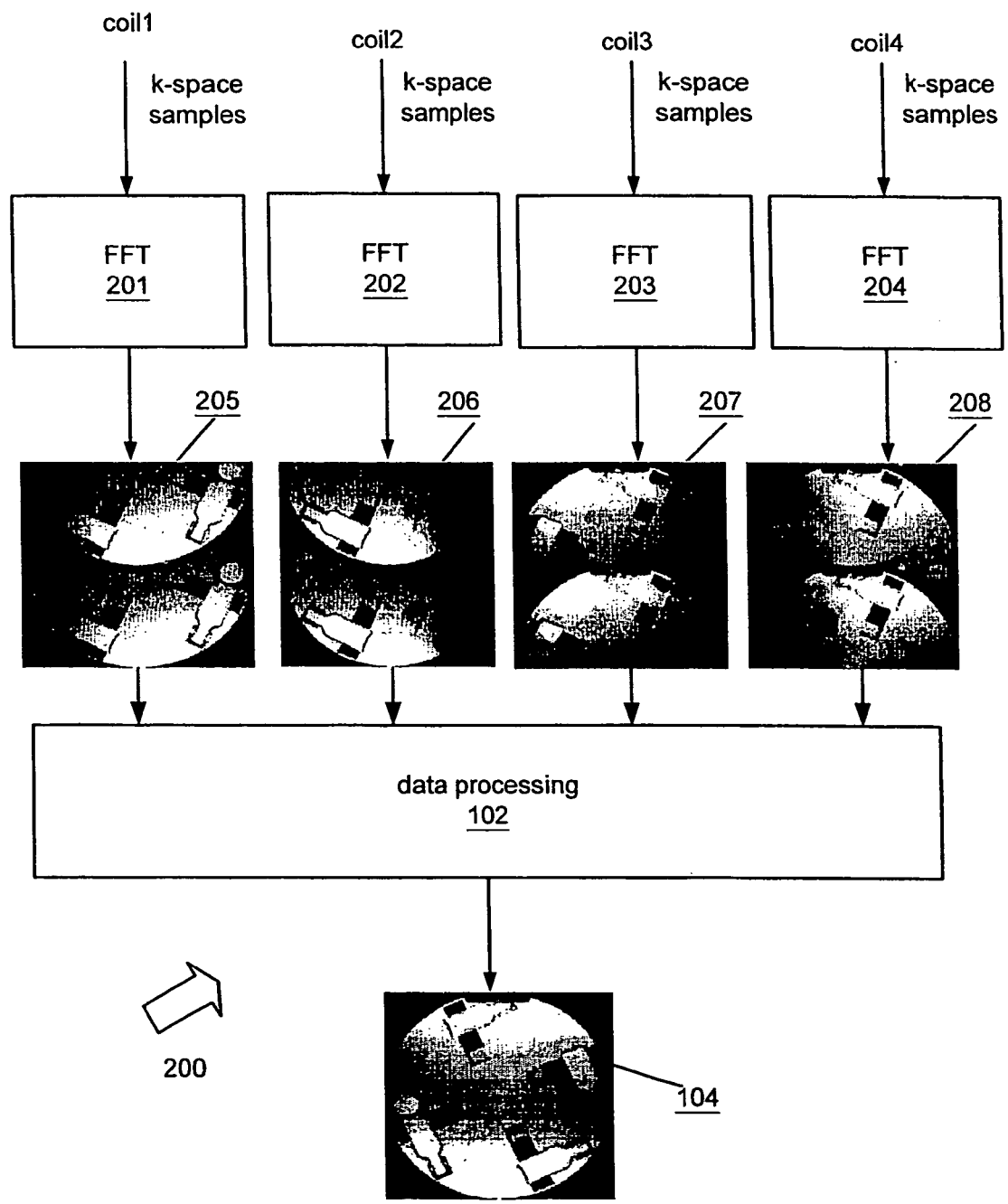
FIG. 2 is a more detailed block diagram of an MRI method embodiment.

FIG. 2 is a more detailed block diagram of a MRI method embodiment 200. MR coils (in this example, coil1, coil2, coil3, and coil4) may be positioned in differing aspects relative to an object to sample. K-space samples may be acquired for each coil. At 201, 202, 203, and 204, an FFT operation is applied to each set of acquired k-space samples, resulting in intermediate images 205, 206, 207, and 208, respectively. In this example, each of the intermediate images 205–208 is comprised of the desired image plus a single ghost artifact. The ghost artifact in this example is a shifted version of the desired final image, with a vertical shift equal to FOV/2 pixels. This situation may arise in SENSE applications where image acquisition is accelerated by a factor R=2, where each set of k-space samples comprises FOV/2 lines, as well as in other applications such as EPI. The intermediate images 205–208 in this example comprise pixels which are a superposition of a desired pixel value and a ghost pixel value. The number of superpositions at a pixel location is equal to R, the acceleration factor. Thus, for R=2, a pixel position (x,y) in each intermediate image may comprise pixel values which are a superposition (sum) of (1) the pixel value at position (x,y) in the final image, and (2) the pixel value from a position (x,y+FOV/2). (More specifically, position (x, (y+FOV/2) mod FOV) where FOV is the pixel height of the image. Henceforth, the position (y+FOV/2) mod FOV) will be referred to simply as $y_{alias}$.) This ghosting effect is also referred to as "fold over" and "mixing".

Data processing 102 may be applied to combine the intermediate images 205–208 to produce the final image 104. When combining, proper weighting of the pixel values of the intermediate images 205–208 may produce pixels in the final image 104 with suppressed ghost artifacts.

Combining the Intermediate Images

Figure 3:
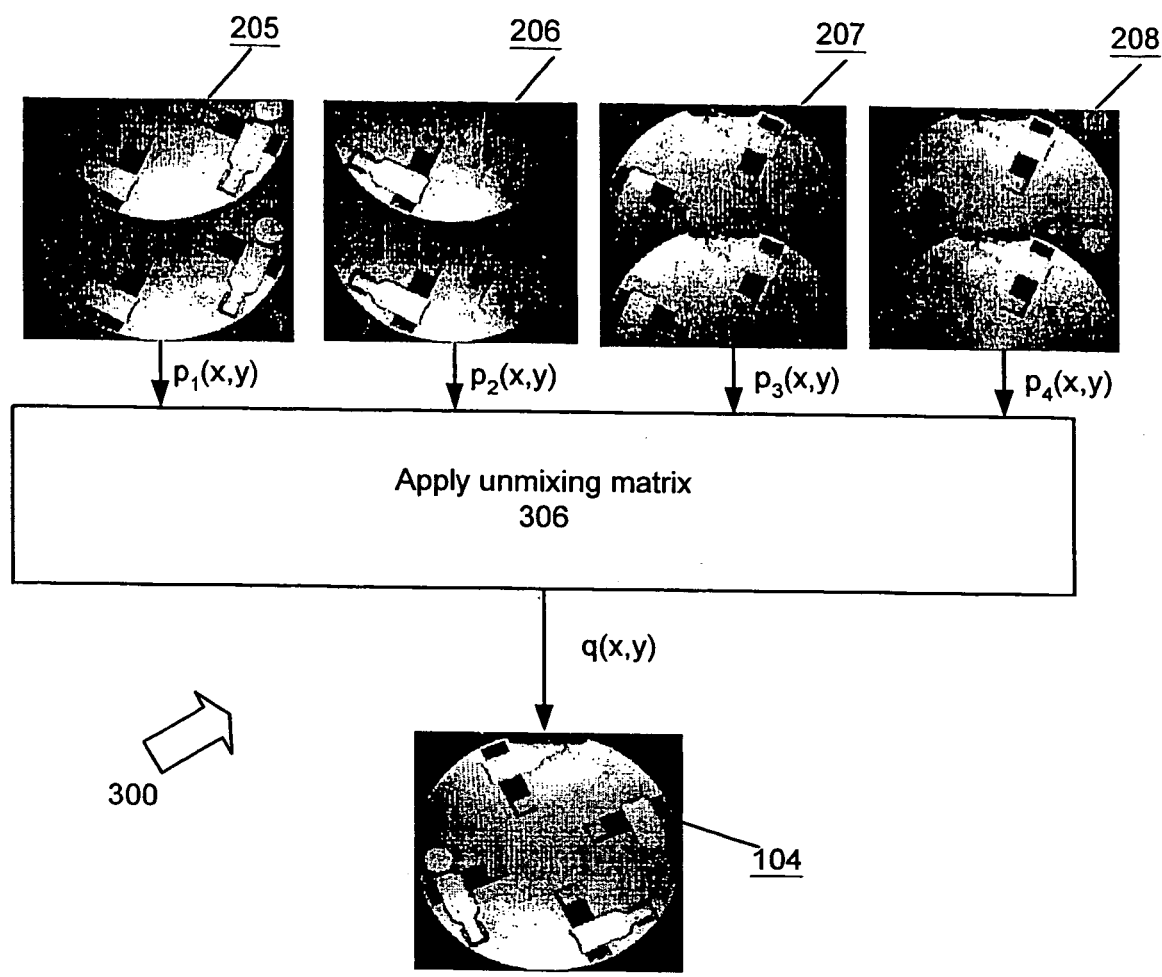
FIG. 3 is a block diagram showing an embodiment of data processing to reduce ghost artifacts in the final image.

FIG. 3 is a block diagram showing one embodiment 300 of data processing to suppress ghost artifacts in the final image. Pixel values $p_i(x,y)$ from corresponding positions (x,y) of the four intermediate images 205–208 may be processed to produce a final image 104 with suppressed ghost artifacts, where i has the range 1 to 4 (in this example with 4 coils). Through application of an unmixing matrix at 306, the pixels $p_i(x,y)$ of the intermediate images 205–208 may be weighted and added together to produce a pixel q(x,y) of the final image 104. Noise may be introduced into the final image due to both (1) noise in the received k-space 30 samples, and (2) inaccuracies in the weights applied to the pixels of the intermediate images. The inaccuracies in the weights, in turn, may result from inaccuracies in the estimated MR coil sensitivities, among other things. The level of noise introduced into the final image is dependent upon the weights. The noise may be reduced at the expense of reduced artifact suppression.

For $N_c$=4, one pixel from each position (x,y) of the intermediate images 205–208 are arranged into a 4×1 ($N_c$×1) vector P. Application of the unmixing matrix may transform P into matrix Q comprising pixel values of the final image 104. In other words, the intermediate images 205–208, when taken together, comprise enough information to separately resolve all pixel values in the final image 104.

The transformation of P to Q, e.g. the separation of superimposed pixels of the intermediate images 205–208 into non-superimposed pixels of the final image 104, may be accomplished by application of the unmixing matrix U.

$$Q = U \cdot P$$

In the SENSE accelerated imaging application, where intermediate images are comprised of R superimposed aliased pixels, the unmixing matrix U is typically formulated as a 2×$N_c$ (R×$N_c$) with pixels locations (x,y) evaluated over FOV/2, which produces a 2×1 (R×1) vector Q, with elements corresponding to (x,y) and (x,$y_{alias}$). The unmixing matrix may equivalently be formulated with U defined as a 1×Nc vector and pixels locations (x,y) taken from the full FOV.

A result of the matrix multiplication of U and P is that each element of Q represents a weighted sum of $N_c$ pixels, one from each corresponding position (x,y) of the intermediate images 205–208. The elements of U are determined such that this weighted sum suppresses ghosting effects which may be present in the pixels of the intermediate images 205–208. In other words, the weighted sum produced by U for each pixel position (x,y) of the intermediate images 205–208 separates the pixel values at that position. The degree of such separation may vary, for reasons and in manners described below.

The elements of U may be determined from transformations involving an $N_c$×R matrix S. Matrix S is referred to as the "sensitivity matrix". Each row i of S corresponds to the "sensitivity" of coil i at a plurality of pixel positions. For R=2, each column j of S comprises (1) a coil sensitivity value for the pixel at position (x,y) of the final image 104, and (2) a coil sensitivity value for the pixel at position $(x,y_{alias})$ of the final image 104. The pixels at positions $(x,y)$ and $(x, y_{alias})$ of the final image are the pixels which superimpose at position $(x,y)$ in the intermediate images 205–208.

Assuming that the elements of S perfectly represent of the actual sensitivities of the coils, then one manner of determining the unmixing matrix U from S involves applying the transformation $$U_0=(S^H\psi^{-1}S)^{-1}S^H\psi^{-1}$$

where $S^H$ represents the conjugate transpose (Hermitian operation) of matrix S, the negative exponent (−1) indicates a matrix inversion operation, and $\psi$ represents the well-known noise covariance matrix for the receiver coils. Here, $U_0$ represents an intermediate determination of U which may comprise an undesirable gain aspect. Manners of compensating for this gain aspect to produce the final matrix U are more fully described below.

Typically, the elements of S are not perfect representations of the actual sensitivities of the coils. It may not be possible to experimentally determine the coil sensitivities with complete accuracy for a particular imaging operation. Furthermore, the sensitivity values may vary according to interactive effects between coils, motion of the target object, and other variables. Thus, the matrix S may comprise errors which deviate from the actual sensitivity values of the coils. Furthermore, the k-space samples may comprise noise which may add to the pixel values of the intermediate images 205–208. Application of the unmixing matrix U to the pixels of the intermediate images 205–208 may amplify this noise, and errors resulting from the errors in S, to undesirable levels in the final image 104.

It may be possible to reduce some of the effects of noise, and errors in S, by applying regularization to the determination of U, in manners which are further described below. Furthermore, an adaptive approach to determination of the sensitivity values may lead to reduced errors in S and thus improve ghost artifact suppression in the final image 104.

Determination of Coil Sensitivity Values

In one embodiment, coil sensitivity values may be determined by acquiring full FOV reference images for each coil. These reference images may be free of substantial ghost artifacts. These reference images may be acquired either before or after the desired imaging operation (for example, accelerated imaging) by performing a 'reference scan'.

In another embodiment, the reference images may be acquired, at least in part, during the course of the imaging operation. One such approach is described in U.S. patent application Ser. No.09/735,263, entitled *Accelerated Magnetic Resonance Imaging*, and filed on Dec. 11, 2000, by Kellman et al (henceforth "Kellman 2"). Kellman 2 teaches a manner in which full FOV k-space samples may be acquired during the course of an accelerated imaging operation and processed into reference images. The reference images may then be applied to adaptively determine the sensitivity values of the coils at different times during the course of the accelerated imaging operation. In other words, both accelerated reduced k-space sampling and slower, full FOV k-space sampling take place over the course of the imaging operation. The images derived from the full FOV samples are applied to adaptively determine sensitivity values for the receiver coils.

In this manner, image target motion and other environmental changes that may effect coil sensitivities may be taken into account during the course of accelerated imaging.

The reference images are full FOV, and thus take longer to acquire, than do the accelerated reduced k-space images. In other words, the reference images have a lower temporal resolution than reduced k-space images, and among other distortions may contain blurring effects due to rapid image target motion (for example, the ventricular motion of a beating heart). However, coil sensitivities adaptively estimated from such reference images may nonetheless prove more accurate over the course of the imaging operation than sensitivities estimated once, prior to the imaging operation.

In addition to adaptively estimating the coil sensitivities, it may be possible to further reduce noise effects in the final image 104 by compromising some ghost artifact suppression. Noise effects in the final image 104 may be further reduced, at the expense of ghost artifact suppression, by "regularizing" or "better conditioning" the matrix inverse operation $(S^H\psi^{-1}S)^{-1}$ in the determination of matrix U. One manner of regularization involves adjustments to the elements of the term $(S^H\psi^{-1}S)$, such that inversion of the term results in less noise amplification. Using this approach, the regularization may be performed by the addition of a matrix $\Lambda$ taking the form $$S^H\psi^{-1}S+\Lambda)^{-1}S^H\psi^{-1}$$

Thus, the regularized determination of matrix U becomes $$U_0=(S^H\psi^{-1}S+\Lambda)^{-1}S^H\psi^{-1}$$

Again, $U_0$ represents a determination of U which may comprise an undesirable gain aspect and which may be compensated for in manners to be described. Prior art regularization techniques have applied a diagonal R×R matrix $\Lambda$ in which the diagonal elements of $\Lambda$ have constant values near but slightly greater than the smallest eigenvalues of the term $S^H\psi^{-1}S$. See for example *SENSE Image Quality Improvement Using Matrix Regularization*, K. F. King et al., Proceedings of the International Society of Magnetic Resonance in Medicine 9, 1771 (2001). In the prior art, the elements of matrix $\Lambda$ are constant for all pixel positions, and are not adaptively determined during the course of an imaging operation.

Adaptive Determination of Regularization Values

Figure 4:
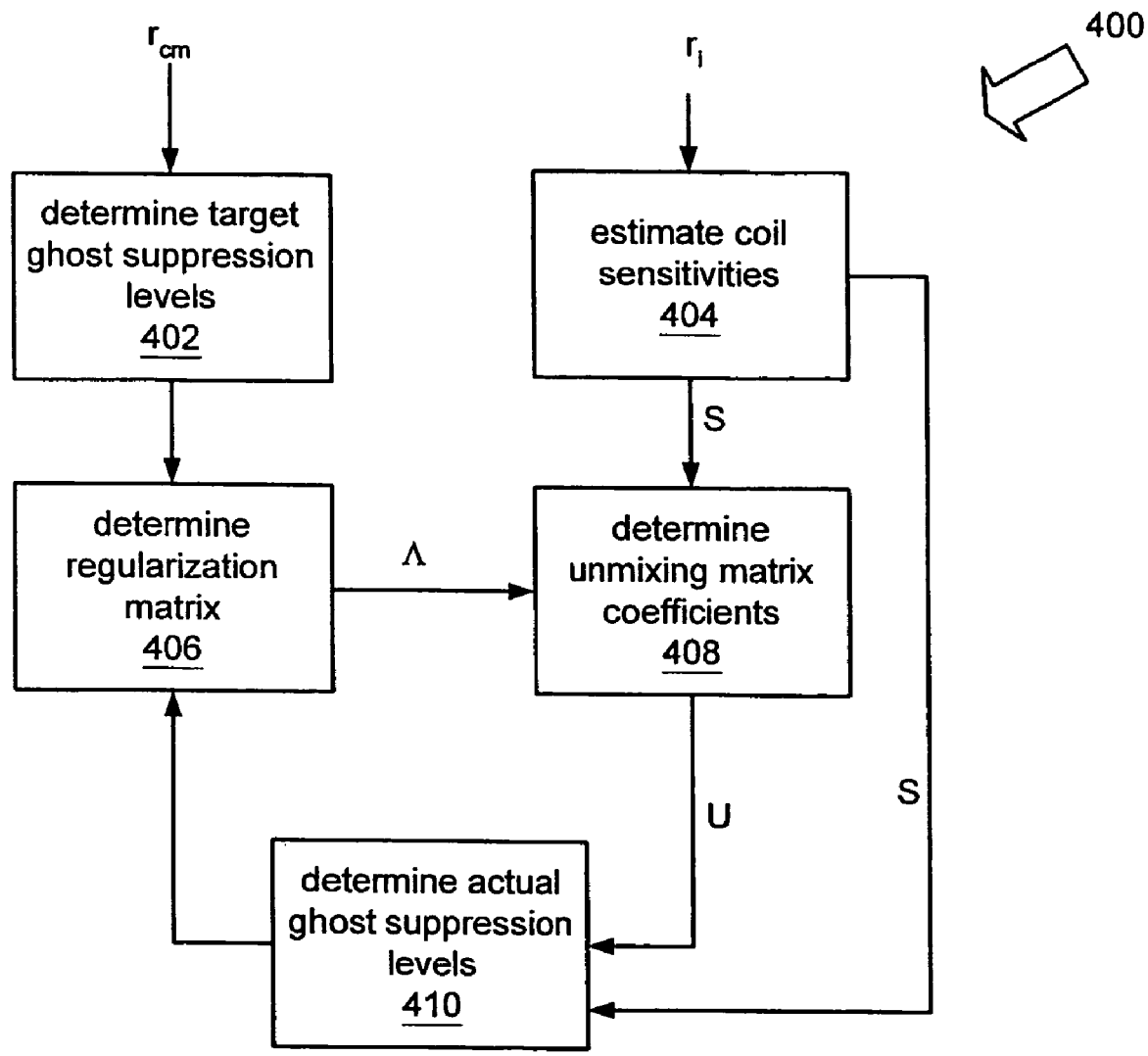
FIG. 4 is a block diagram showing an embodiment of an adaptive, spatially-variant regularization method.

FIG. 4 is a block diagram showing an embodiment 400 of an adaptive, spatially-variant regularization method. In one embodiment, $\Lambda$ is a diagonal R×R matrix with element values determined according to a target level of ghost artifact suppression to apply to one or more pixels in the final image. The target level of ghost artifact suppression to apply, and the coil sensitivities, may be adaptively determined according to reference images acquired during the course of an imaging operation, as well as static reference images acquired before and/or after the imaging operation.

In one embodiment, a set of reference images $r_i$ (one for each coil from which k-samples are acquired) is applied to determine the sensitivity matrix S at 404. The reference images $r_i$ may be combined to produce a 'combined-magnitude' reference image $r_{cm}$ which is applied to determine, at 402, a target level of ghost artifact suppression to apply to each pixel of the final image. In one embodiment, the value of a pixel $r_{cm}(x,y)$ comprises the combined magnitude of the corresponding pixel values in $r_i$, e.g. the square root of the sum of the squares of the complex pixel values $r_i(x,y)$. In another embodiment, for which generalized phased array ghost cancellation produces R separated ghosts (as described in Kellman1), the combined magnitude for each individual separated ghost image may be input to the determination of target ghost suppression, at 402. In this case, the target artifact suppression may be calculated as the ratio of desired pixel and ghost pixel using pixels in separated images. The sensitivity matrix S may be calculated from either a single image (as shown in FIG. 4) or from multiple separated ghosts as described in Kellman1. In another embodiment, the combined magnitude reference image $r_{cm}(x,y)$ used for calculating the regularization matrices may be calculated from an initial application of unmixing using unmixing matrices ($U_0$) calculated using a smaller fixed regularization or without any regularization.

Consider a pixel at position (x,y) of the final image. For R=2, the corresponding pixel in the intermediate images will have a value which is the superposition (sum) of the pixel values in the final image at positions (x,y) and $(x,y_{alias})$. Thus, in one embodiment, the target level of ghost artifact suppression to apply to the pixel at position (x,y) of the final image is proportional to the ratio $r_{cm}(x, y_{alias})/r_{cm}(x,y)$. For example, if the pixel at position (x,y) has an intensity value of one (1), and the intensity value of the pixel at position (x, $y_{alias}$) is five (5), the ratio is 5:1. A target level of ghost artifact suppression to apply to the pixel at position (x,y) may be around five times larger than a target level to apply to a pixel at a position where the ratio is closer to one.

The target levels of ghost artifact suppression may be chosen according to various criteria In one embodiment, the target level of ghost artifact suppression to apply to a pixel at a position (x,y) is chosen as a percentage of the intensity value of the pixel in the reference image. In another embodiment, a level of noise present in a pixel value at position (x,y) of the reference image is determined. A target level of ghost artifact suppression is chosen to reduce the ghost artifact of the pixel to a level on order with the level of noise.

Coil sensitivities are estimated at 404. The coil sensitivities may be estimated from the reference image in various manners, for example in the manners detailed in Kellman 2. The estimated coil sensitivities S are provided to determine the unmixing matrix U at 408.

At 406, the regularization matrix is determined according to the target levels of ghost artifact suppression. In one embodiment, initial values are chosen for the elements of the regularization matrix Λ. At 410, actual levels of ghost artifact suppression for each pixel of the final image are determined from the matrix U which was determined according to (1) this initial Λ, and (2) the estimated S. The noise covariance may be incorporated for optimized SNR as in previous described matrix formulation for U. The noise covariance may be a separate noise-only reference scan or estimated during imaging from noise-only pixels. Iterative adjustments to the elements of Λ are made until the target level of ghost artifact suppression is achieved. For each iteration, the actual level of ghost artifact suppression is checked with the target level of ghost artifact suppression for the pixel, and the element values of Λ are adjusted accordingly, if necessary, to bring the actual level of ghost artifact suppression closer to the target level.

An actual level of ghost artifact suppression for a pixel at position (x,y) of the final image may be determined from the matrix product, $$\rho = U \cdot S$$

where the diagonal of ρ may be normalized to all ones (1s). For R=2, the off-diagonal elements of ρ are then each proportional to the actual ghost artifact suppression applied to the pixels at positions (x,y) and (x, $y_{alias}$). For R=2, adjustments to the diagonal elements of Λ may independently affect the elements of ρ. In other words, adjusting a particular diagonal element of Λ may independently affect the actual ghost artifact suppression for a particular pixel of the final image. For R=2, adjusting element $\Lambda_{2,2}$ affects the actual ghost artifact suppression represented by element $\rho_{1,2}$, independent of $\rho_{2,1}$. Likewise, adjusting element $\Lambda_{1,1}$ affects the actual ghost artifact suppression represented by element $\rho_{2,1}$, independent of $\rho_{1,2}$.

In one embodiment, this process may be repeated for each pixel of the final image until the actual ghost artifact suppression is in accordance with the target level. Of course, other manners of determining the values of Λ which achieve the desired ghost artifact suppression may also be employed, such as closed-end solutions, which do not involve an iterative process.

At various stages of the imaging operation, a new reference image may be provided to update the determination of target ghost artifact suppression levels and coil sensitivities. See Kellman 2 for a description of one manner in which this may be done. To compensate for motion distortions in the low temporal resolution reference images, an 'order filter' may be applied in one embodiment. Corresponding elements of the determined regularization matrix Λ may be compared within a neighborhood of pixels. The elements of the Λ matrix for the pixel at the center of the neighborhood may then be set to the minimum element values of the Λ matrices for all pixels in the neighborhood. For example, consider the following 3×3 pixel neighborhood $p_1 p_2 p_3$
$p_4 p_5 p_6$
$p_7 p_8 p_9$ The matrix Λ for $p_5$ may be set to comprise the minimum element values of Λ for the set of pixels $P_1$–$p_9$. This process may be repeated for each pixel of the final image to reduce errors related to the low temporal resolution of the reference image.

Adjusting the Gain

Recall that in one embodiment, an unmixing matrix $U_0$ comprising a gain aspect is determined by $$U_0 = (S^H \psi^{-1} S + \Lambda)^{-1} S^H \psi^{-1}$$

In one embodiment, a gain matrix G may be included into the determination of U, to compensate for the gain aspect of $U_0$, as follows, $$U = G \cdot U_0 = G(S^H \psi^{-1} S + \Lambda)^{-1} S^H \psi^{-1}$$

For a diagonal matrix Λ, the term $G(S^H \psi^{-1} S + \Lambda)^{-1}$ approaches $G(\Lambda)^{-1}$ as the values of the diagonal elements of Λ are increased. In one embodiment, the term $G(S^H \psi^{-1} S + \Lambda)^{-1}$ may be reduced to $G(\Lambda)^{-1}$ when the diagonal values of Λ are substantially larger than the maximum eigenvalues of the term $S^H \psi^{-1} S$. In this case, $$U = G(\Lambda)^{-1} S^H \psi^{-1} \text{ (approximately)}$$

It is known that, in the absence of ghost artifacts, optimal signal-to-noise ratio (SNR) may be achieved in the final image where U is proportional to $S^H \psi^{-1}$. However, in this case no ghost artifact suppression takes place. See for example *The NMR Phased Array*, Roemer et al., *Magnetic Resonance in Medicine* 1990; 16:192–225 (henceforth Roemer). In one embodiment, when the target ghost artifact suppression for a pixel is low, the term $G(\Lambda)^{-1}$ may be set to approximately the identity matrix I, in which the value of all diagonal elements is approximately one. Thus, $$U = G(\Lambda)^{-1} S^H \psi^{-1} = I S^H \psi^{-1} = S^H \psi^{-1}$$

In other words, for pixels where ghost artifact suppression is not substantially needed, the elements of the matrices G and Λ may be determined such that the SNR for the pixel in the final image is close to the optimum levels as determined, for example, in Roemer.

For pixels where the ghost artifact suppression to apply is substantial, G may be determined such that the diagonal elements of the matrix product G·ρ are close to one. In other words, $$G \approx \begin{bmatrix} \frac{1}{\rho_{11}} & 0 \\ 0 & \frac{1}{\rho_{22}} \end{bmatrix}$$

where $\rho_{11}$ and $\rho_{22}$ are diagonal elements of the matrix $\rho_0 = U_0 \cdot S$. As a consequence of compensating for the gain aspect of $U_0$, the pixels in the final image may have a more desirable intensity.

Figure 5:
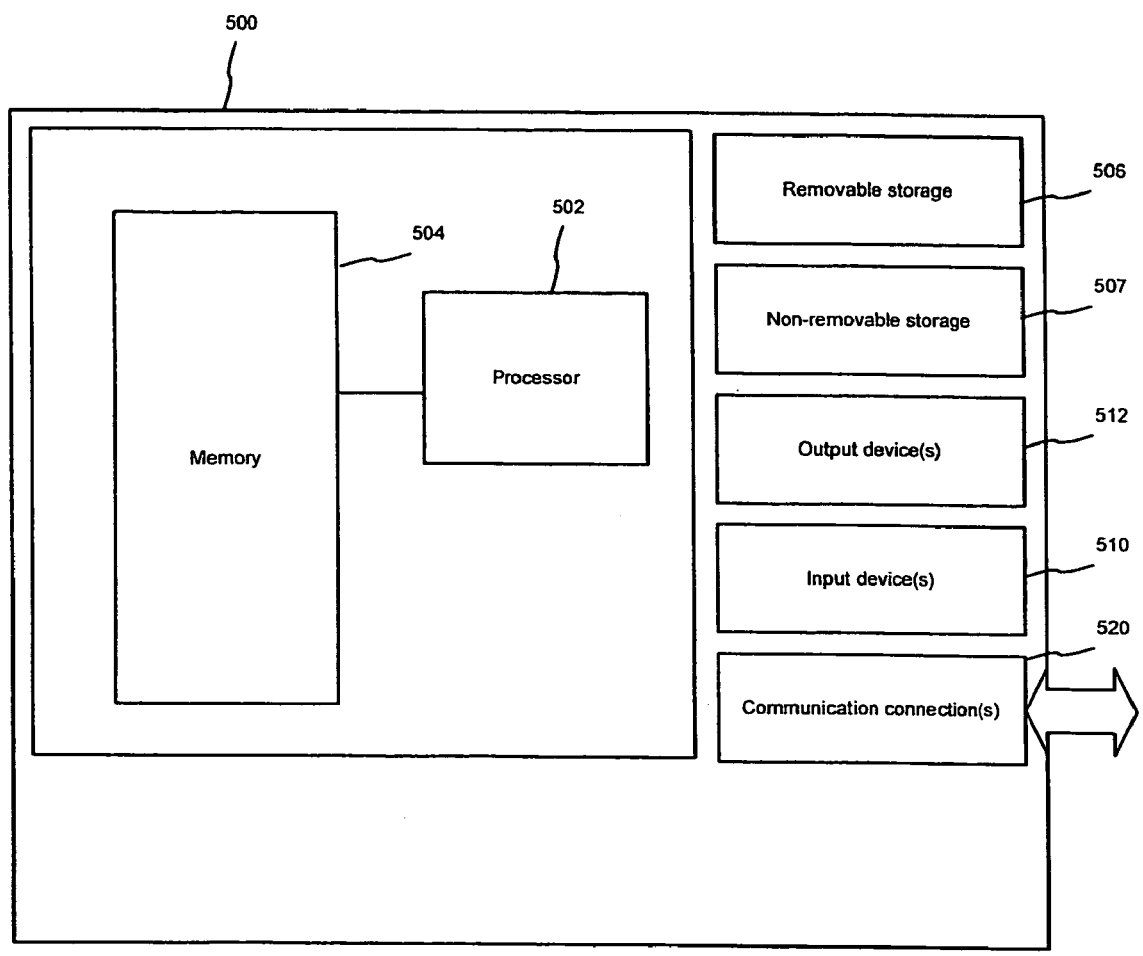
FIG. 5 is a block diagram of an apparatus embodiment.

FIG. 5 is a block diagram of an apparatus embodiment 500. The apparatus 500 comprises a processing unit 502 (e.g., a processor, microprocessor, micro-controller, etc.) and machine-readable media 504. Depending on the configuration and application (mobile, desktop, server, etc.), the memory 504 may be volatile (such as RAM), non-volatile (such as ROM, flash memory, etc.) or some combination of the two. By way of example, and not limitation, machine readable media 504 may comprise volatile and/or nonvolatile media, removable and/or non-removable media, including: RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information to be accessed by the apparatus 500. The machine readable media 504 may be implemented in any method or technology for storage of information such as computer readable instructions, data structures, program modules or other data.

The media 504 may comprise instructions and/or data which, when executed by the processor 502, may result in the apparatus 500 carrying out acts in accordance with embodiments of the methods described herein.

The apparatus 500 may comprise additional storage (removable 506 and/or non-removable 507) such as magnetic or optical disks or tape. The apparatus 500 may further comprise input devices 510 such as a keyboard, pointing device, microphone, etc., and/or output devices 512 such as display, speaker, and printer. The apparatus 500 may also typically include network connections 520 (such as a network adapter) for coupling to other devices, computers, networks, servers, etc. Using either wired or wireless signaling media.

The components of the device may be embodied in a distributed computing system. For example, a terminal device may incorporate input and output devices to present only the user interface, whereas processing component of the system are resident elsewhere. Likewise, processing functionality may be distributed across a plurality of processors.

The apparatus may generate and receive machine readable instructions, data structures, program modules or other data in a modulated data signal such as a carrier wave or other transport mechanism. These instructions and/or data may, when executed by the processor 502, result in acts in accordance with procedures of the present invention. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Communications media, including combinations of any of the above, should be understood as within the scope of machine readable media.

Having described and illustrated the present invention with reference to one or more illustrated embodiments, it will be recognized that the illustrated embodiments can be modified in arrangement and detail without departing from the principles and scope of the present invention. It should be understood that the programs, processes, or methods described herein are not related or limited to any particular type of data processing apparatus, unless indicated otherwise. Various types of general purpose or specialized data processing apparatus, including desktop computers and workstations, may be used with or perform operations in accordance with the teachings described herein. Elements of the illustrated embodiments may be implemented in software, hardware, firmware, or combinations thereof In view of the many possible embodiments to which the principles of the present invention may be applied, it should be recognized that the detailed embodiments are illustrative only and should not be taken as limiting in scope. Rather, the present invention encompasses all such embodiments as may come within the scope and spirit of the following claims and equivalents thereto.

We claim:

1. An MRI imaging system comprising:
   at least one processor;
   a plurality of coils to acquire a plurality of k-space samples of a target to image; and
   a machine-readable media comprising instructions which, when executed by the processor, result in
   determining a plurality of different regularization matrices for a plurality of different regions of an image of the target;
   applying the regularization matrices in the determination of a plurality of unmixing matrices for the regions; and
   applying the unmixing matrices to produce the image without ghost artifacts from a plurality of MRI images produced from the plurality of k-space samples and each comprising ghost artifacts.

2. The system of claim 1 wherein the instructions, when executed by the processor, further result in:
   adaptively determining the different regularization matrices according to a plurality of reference images acquired over the course of an imaging operation of the target.

3. The system of claim 2 wherein the instructions, when executed by the processor, further result in:
   determining the regularization matrices according to a plurality of different target ghost suppression levels for the regions of the image.

4. The system of claim 3 wherein the instructions, when executed by the processor, further result in:
   adapting the regularization matrices according to differences between actual ghost suppression levels for the regions and the different target ghost suppression levels for the regions.

5. The system of claim 1 wherein the instructions, when executed by the processor, further result in:

adaptively determining sensitivity values for the coils according to a plurality of reference images acquired over the course of an imaging operation of the target; and applying the adaptively determined coil sensitivity values to the determination of the unmixing matrices.

6. The system of claim 1 wherein the instructions, when executed by the processor, further result in:

determining the regularization matrix for a first region of the different regions from the minimum element values of the regularization matrices of surrounding regions.

7. The system of claim 6 wherein each different region comprises a single pixel position of the image.

8. The system of claim 1 wherein each different region comprises a single pixel position of the image.

9. An MRI imaging system, comprising:

a plurality of coils to acquire reduced k-space samples for a plurality of intermediate images; and an apparatus comprising at least one processor to execute instructions to combine the intermediate images to produce a full field of view image by applying a plurality of unmixing matrices, each unmixing matrix regularized according to a target level of alias suppression for a region of the full field of view image.

10. The system of claim 9 wherein the coils further operate to acquire at least one reference image during the course of an imaging operation, and wherein the instructions, when executed, further result in adjusting the target level of alias suppression according to the at least one reference images.

11. A method comprising:

acquiring a plurality of undersampled MRI images; and combining the plurality of undersampled MRI images to produce a full field of view image by applying a plurality of unmixing matrices, each unmixing matrix regularized according to a target level of alias suppression for a region of the full field of view image.

12. The method of claim 11 further comprising:

adjusting the target level of alias suppression according to reference images acquired over the course of an imaging operation.

13. A computer-implemented method, comprising:

determining a plurality of different regularization matrices for a plurality of different regions of an image;

applying the regularization matrices in the determination of a plurality of unmixing matrices for the different regions; and applying the unmixing matrices to a plurality of undersampled MRI images with ghost artifacts to generate the image without ghost artifacts.

14. The method of claim 13 wherein determining a plurality of different regularization matrices further comprises:

adaptively determining the different regularization matrices according to a plurality of reference images acquired over the course of an imaging operation.

15. The method of claim 14 wherein determining a plurality of different regularization matrices further comprises:

determining the regularization matrices according to a plurality of different target ghost suppression levels for the different regions of the image.

16. The method of claim 15 wherein determining a plurality of different regularization matrices further comprises:

adapting the plurality of regularization matrices according to differences between actual ghost suppression levels for the plurality of pixel positions and the plurality of different target ghost suppression levels for the plurality of regions.

17. The method of claim 15 in which the plurality of target ghost suppression levels are chosen as a percentage of an intensity value of the different regions.

18. The method of claim 15 in which a level of noise present in the different regions is determined and the plurality of target ghost suppression levels are chosen to reduce a ghost artifact of the different regions to a level on order with the level of noise.

19. The method of claim 13 wherein the determination of a plurality of unmixing matrices for the plurality of different regions further comprises:

adaptively determining coil sensitivity values according to a plurality of reference images acquired over the course of an imaging operation; and applying the adaptively determined coil sensitivity values to the determination of the unmixing matrices.

20. The method of claim 13 wherein determining a plurality of different regularization matrices for a plurality of different regions of an image further comprises:

determining the regularization matrix for a first region of the different regions from the minimum element values of the regularization matrices of surrounding regions.

21. The method of claim 13 in which each region comprises a single pixel of the image.

22. The method of claim 20 in which each region comprises a single pixel of the image.

* * * * *